US006822916B2

(12) United States Patent
Frey et al.

(10) Patent No.: US 6,822,916 B2
(45) Date of Patent: Nov. 23, 2004

(54) READ/WRITE AMPLIFIER HAVING VERTICAL TRANSISTORS FOR A DRAM MEMORY

(75) Inventors: Alexander Frey, München (DE); Werner Weber, München (DE); Till Schlösser, Dresden (DE)

(73) Assignee: Infineon Technologies AG, Munich (DE)

( * ) Notice: Subject to any disclaimer, the term of this patent is extended or adjusted under 35 U.S.C. 154(b) by 442 days.

(21) Appl. No.: 09/796,207

(22) Filed: Jun. 1, 2001

(65) Prior Publication Data

US 2001/0030884 A1 Oct. 18, 2001

(30) Foreign Application Priority Data

Feb. 28, 2000 (DE) .......................................... 100 09 346

(51) Int. Cl.[7] .................................................. G11C 7/00
(52) U.S. Cl. ........................ 365/205; 365/63; 365/203; 365/206
(58) Field of Search .................................. 365/149, 205, 365/206, 207, 208, 203, 63, 51

(56) References Cited

U.S. PATENT DOCUMENTS

| 4,604,534 A | * | 8/1986 | Pricer ............................. 327/57 |
|---|---|---|---|
| 5,416,350 A | * | 5/1995 | Watanabe .................... 257/330 |
| 5,508,966 A | | 4/1996 | Nakase | |
| 5,920,778 A | | 7/1999 | Rösner et al. | |
| 6,043,527 A | * | 3/2000 | Forbes ......................... 257/296 |
| 6,049,496 A | | 4/2000 | Forbes et al. | |

FOREIGN PATENT DOCUMENTS

EP                0 823 131 B1      2/1998

* cited by examiner

*Primary Examiner*—Son T. Dinh
(74) *Attorney, Agent, or Firm*—Laurence A. Greenberg; Werner H. Stemer; Gregory L. Mayback

(57) ABSTRACT

As a consequence of DRAM memory cell miniaturization, the available space for read/write amplifiers decreases in width from hitherto 4 bit line grids to 2 bit lines grids. Conventionally previously known read/write amplifiers cannot be accommodated on this reduced, still available space. Therefore, it has not been possible hitherto to provide read/write amplifiers arranged beside one another which would manage with the novel DRAM memory cell spacings. The principle underlying the invention is based on replacing at least some of the transistors of conventional design which are usually used for read/write circuits by "vertical transistors" in which the differently doped regions are arranged one above the other or practically one above the other. Compared with the use of conventional transistors, the use of vertical transistors saves enough space to ensure an arrangement of a read/write circuit in the grid even with a reduced grid width.

24 Claims, 7 Drawing Sheets

READ/WRITE AMPLIFIER HAVING VERTICAL TRANSISTORS FOR A DRAM MEMORY

BACKGROUND OF THE INVENTION

Field of the Invention

The present invention relates to read/write amplifiers for DRAM memories which are embodied with vertical transistors.

Dynamic Random Access Memories (DRAM memories) represent the most important type of memories for storing digital information. Each DRAM memory cell comprises a transistor for addressing the cell and a capacitance for storing a charge which represents the information stored in the memory cell.

The memory cells are connected in matrix-type arrangements. What is called a word line and a bit line lead to each memory cell, all the memory cells of a row being connected to the same word line or to two word lines which are respectively connected to every second cell and each of the rows of the matrix of memory cells being connected to one or two bit lines. Activation of a specific word line enables all the memory cells connected thereto to be read via their bit lines, written to or refreshed with regard to their information content. Refreshing is necessary in DRAM memory cells since the charge stored in the capacitance is lost over the course of time on account of leakage currents, especially in the case of integrated modules.

In order to read out the information contained in memory cells, or in order to refresh the information, what are called read/write circuits are used, which are respectively connected usually to two bit lines. The coupling to two bit lines enables a comparison of the charge differences and thus simplifies the assessment of a memory cell content.

FIG. 1 shows an example of such a read/write device—known in the prior art—for reading DRAM memory cells. This circuit essentially comprises a multiplexer section A, an evaluation section B and a precharge/equalize section C. The heart of the circuit is formed by the evaluation section B with a flip-flop which comprises two transistor pairs having transistors of the same polarity, namely the nMOS transistors T1 and T2, and respectively the pMOS transistors T4 and T5. In the present example, the read/write amplifier is connected to two bit lines, the bit line BL and the reference bit line BBL. In this case, BBL is connected via the connection 10 to the gate of the transistor T1, while BL is connected via the connection 12 to the gate of the transistor T2. Furthermore, BBL is connected via the connection 11 to one of the source/drain regions of the transistor T2 and BL is connected via the connection 13 to a source/drain region of the transistor T1.

The other source/drain region of the two transistors is connected via the SAN connection 14 to the transistor T3, which can be switched via the connection 15 by means of the signal NSET via the signal line, or interconnect 17, in order to be able to be pulled to ground (GND). This is done via the ground line 18 and the connection 16, which is connected to the other source/drain region of the transistor T3. The second transistor pair, comprising the transistors T4 and T5, is connected up in the same way to the bit lines BL and BBL, but VDD rather than ground can be applied to the transistor T6. This circuit arrangement effects a segregation of the possible signal states to form unambiguous signal levels, which allows assessment of the cell content with regard to logic 1 or logic 0.

The multiplexer section A comprises the two transistors T7 for the bit line BL and T8 for the bit line BBL. In this case, the bit line BL is connected via the connection 34 to a source/drain region of the transistor T7, while the bit line BBL is connected via the connection 31 to the transistor T8. Via the MUX line 36, a multiplexer signal can be fed to the connections 33 and 30 of the transistors T7 and T8, with the result that the latter switch on. In the event of switch-on, the voltage present on BL, and respectively BBL, is forwarded via the connections 35 and 32.

Finally, the precharge/equalizer section C comprises the three transistors T9, T10 and T11. While BBL is connected via a connection 40 to a source/drain region of the transistor T10, BL is connected via the connection 42 to a source/drain region of the transistor T9. The respective other source/drain regions of the two transistors T9 and T10 are connected via the connection 44 to the VBLEQ signal line 46. The transistor T11 is simultaneously connected to both bit lines in its source/drain region via the connection 41 to BBL and via the connection 43 to BL. All three gate regions of the transistors T9, T10 and T11 are connected via the connection 45 to the EQ line 47. The circuit described here for a read/write circuit is to be regarded as by way of example. It is not intended to restrict the invention and can undergo numerous variations.

DRAM memory modules are subject to intense cost pressure. Today's DRAM memories are realized practically exclusively as integrated semiconductors in which the arrangements of memory cells, word line including word line driving arrangement, bit line including the bit line driving arrangement, etc, are projected on an integrated circuit directly as structures of a silicon wafer. The main factor in the costs of fabricating integrated circuits is the size of the silicon surface used in each case. Therefore, under the existing cost pressure, there are great efforts to make the chip area for a specific number of memory cells, including their support logic, as small as possible. Continual miniaturization is practically permanently necessary for reasons of cost pressure. To that end, the inherent architecture of the DRAM memory cell is also permanently being optimized. Starting from the 1 Gbit generation, the architecture of such a DRAM memory cell enables an area consumption of less than 8 $F^2$, where F represents the minimum feature size that can be produced lithographically or half a grid width of a bit line in a sequence of parallel bit lines. A consequence of this reduction of area is that for the bit line architecture there is a transition from a "folded" concept, in which typically two word lines which respectively address every second cell are routed beside one another, to what is called the "open" concept, in which just one word line is used, which can address each cell of a row. A comparison of the quantities of charge of two adjacent bit lines is at present impossible in this way. Therefore, a parallel reference bit line cannot be used as a reference. Instead, a reference bit line is routed to another cell array in order still to be able to carry out a comparison of the voltages of an addressed bit line and of a nonaddressed reference bit line. The omission of the second, parallel bit line reduces the available width for the read/write amplifier. As a consequence of DRAM memory cell miniaturization, with a conventional word-line and bit-line arrangement, the available space for the read/write amplifier decreases in width from hitherto 8 F to 4 F. In a further embodiment, two bit lines which lead to different cell arrays, for example cell arrays adjacent in strips, are arranged one above the other.

Conventionally previously known read/write amplifiers cannot be accommodated on this reduced, still available space. Therefore, it has not been possible hitherto to provide a read/write amplifiers arranged beside one another which would manage with the novel DRAM memory cell spacings. Instead, it has been necessary to adapt the arrangement of the read/write circuits on the chip to the conditions of the reduced cell size. However, such arrangements once again increase the area requirement of the read/write circuits to be accommodated and thus adversely affect the overall costs of each individual DRAM memory module.

SUMMARY OF THE INVENTION

The invention is thus based on the object of providing a read/write circuit which can be inserted into the reduced grid with a width of just 4 F of modern DRAM memory modules.

This object is achieved by providing an integrated read/write circuit that includes at least one vertical transistor and/or by providing an integrated DRAM memory that includes a read/write circuit with at least one vertical transistor.

The principle underlying the invention is based on replacing at least some of the transistors of conventional design which are usually used for read/write circuits by "vertical transistors" in which the differently doped regions are arranged one above the other or practically one above the other. Compared with the use of conventional transistors, the use of vertical transistors saves enough space to ensure an arrangement of a read/write circuit in the grid even with a reduced grid width.

Accordingly, the invention is directed at an integrated read/write circuit for evaluating at least one bit line in a DRAM memory which is characterized in that at least one transistor used in the read/write circuit is a vertical transistor.

The read/write circuit can have, in a customary manner, at least two transistor pairs of different channel types for evaluation purposes, in which case the transistors used for the transistor pairs of the read/write circuit may be vertical transistors. Since the transistor pairs usually form the heart of a read/write circuit, this makes it possible to cover a sufficiently small space in order to be able to achieve the object according to the invention.

In order to enable a particularly space-saving arrangement of the vertical transistors within a transistor pair, it may furthermore be preferred for these to have a common source/drain region via which they can be supplied with the respectively necessary voltage (SAN, SAP inputs). Since in each case one of the source/drain regions of the transistors of each transistor pair are at a common potential, this solution is suitable for obtaining a further simplification of the silicon regions required on the chip.

Transistors are also used for connecting the voltages (VDD, GND) required for operation of the transistor pairs to the transistor pairs. According to the invention, these transistors may also be vertical transistors.

An even more extensive simplification of the circuit can be obtained by both the vertical transistors of an arbitrary transistor pair and the vertical transistor used for connecting the voltage for this transistor pair having a common source/drain region.

As shown in FIG. 1, the source/drain regions of the transistor pairs are linked to the associated switching transistors anyway, so that the installation of a common source/drain well is appropriate. The common source/drain region of the vertical transistors may be connected to a voltage source (VDD or GND) via a SET line, that is to say an NSET or a PSET line depending on the type of transistor.

In order to be able to achieve the space saving sought, it is preferred for the vertical transistors used for the transistor pairs to have a width in the transverse direction with respect to the at least one bit line such that it approximately corresponds to the grid width of the bit lines. In this case, the grid width of a bit line is the extent encompassed by the width of one bit line including the necessary distance from the next bit line. This makes it possible to ensure that the two transistors required for each transistor pair can be arranged beside one another, which, for example, simplifies the use of common source/drain regions.

Furthermore, the read/write circuit according to the invention preferably has a multiplexer circuit for switching the at least one bit line, the transistors used for the multiplexer circuit being vertical transistors. By realizing further assemblies of the read/write circuit with the aid of vertical transistors, it is possible to eliminate further bottlenecks in the layout. The multiplexer circuit can also expediently be designed in such a way that it fits into the predetermined grid.

To attain a further space saving, at least some of the vertical transistors for switching all the bit lines may have a common polysilicon gate region. In this case, "all" the bit lines should be understood to mean all the bit lines which are assigned to a specific read/write circuit, but not all the bit lines which are actually present in the DRAM memory.

Furthermore, the common polysilicon gate region of the vertical transistors may preferably be connected to a multiplexer signal source in order to be able to switch the transistors via the gate regions.

Finally, the read/write circuit according to the invention may also have a precharge/equalize section, in which case the transistors used for the precharge/equalize circuit may be vertical transistors.

Consequently, it is possible for all three subcircuits of the overall read/write circuit according to the invention to be equipped with vertical transistors at least in parts. It is particularly preferred if the entire read/write circuit is equipped with vertical transistors in all its parts, in order to be able to comply with the predetermined narrow grid of modern DRAM memories.

Preferably, at least some of the vertical transistors of the precharge/equalize circuit have a common polysilicon gate region. Here, too, the basic principle manifested is once again that of projecting connectable regions of different transistors by means of common structures in the silicon in order to keep the overall structure simple and to reduce the spatial requirement.

The common polysilicon gate region of the vertical transistors of the precharge/equalize circuit is preferably connected to an equalize signal source (EQ).

Furthermore, the precharge/equalize circuit may have a transistor for each of the at least one bit line, which transistor is connected to a voltage source at a source/drain region, these source/drain regions of the transistors forming a common source/drain region.

In terms of their construction, the vertical transistors preferably have a projection on the substrate material, whose side walls act as a channel, a first source/drain region formed by a layer which is arranged on the projection and is made of material having an inverse doping with respect to the substrate, a second source/drain region formed by a layer which is arranged on the substrate beside the projection and is made of material having an inverse doping with respect to the substrate, and a gate region made of polysilicon. The gate region is arranged on the side walls of the projection and on the junction between the side walls of the projection and the second source/drain region. Furthermore, the polysilicon may form a polysilicon contact region in order to be able to make contact with the gate region.

This preferred arrangement of a vertical transistor makes it possible to achieve a major space saving in comparison with the use of conventional, horizontally arranged transistors. By way of example, the projection may be designed in such a way that, in the transistors of the transistor pairs, it has a width which allows it to be inserted into the width grid of the bit lines, i.e. a width which approximately corresponds to half a grid width of the bit line (since the interspaces must also be realized). In this case, therefore, it is possible to approach the lithographic minimum when forming structures. Other transistors may have a projection whose width approximately corresponds to the grid width of one bit line, with the result that they occupy the entire grid width up to the next bit line and fit into two grid widths. This may be preferred when there is no need to provide two adjacent transistors for each bit line or bit line group, rather just one transistor, but the latter possibly has to be controlled by two bit lines.

The read/write circuit according to the invention is, in particular, preferably characterized in that it is connected to two bit lines. An arrangement with two bit lines corresponds to the previous procedure in the design of read/write devices and simplifies the application of the transistor pairs, since the latter can be supplied by the two bit lines. The bit lines can lead to different memory sides of the DRAM memory. However, it may be preferred to have the two bit lines lead to one memory side. In this case, it is appropriate for the two bit lines to be arranged above the read/write circuit and one above the other with regard to the main plane of the DRAM memory. The bit lines can then be connected to the vertical transistors preferably via essentially vertical interconnects which reach from the bit lines down to the transistors.

BRIEF DESCRIPTION OF THE DRAWINGS

The invention is furthermore directed at the use of vertical transistors for the read/write circuits of an integrated DRAM memory. With regard to the advantages of this use according to the invention, reference is made to the explanations with regard to the read/write circuit according to the invention, and reference is made to the entire contents thereof.

DESCRIPTION OF THE PREFERRED EMBODIMENT

Figure 1:
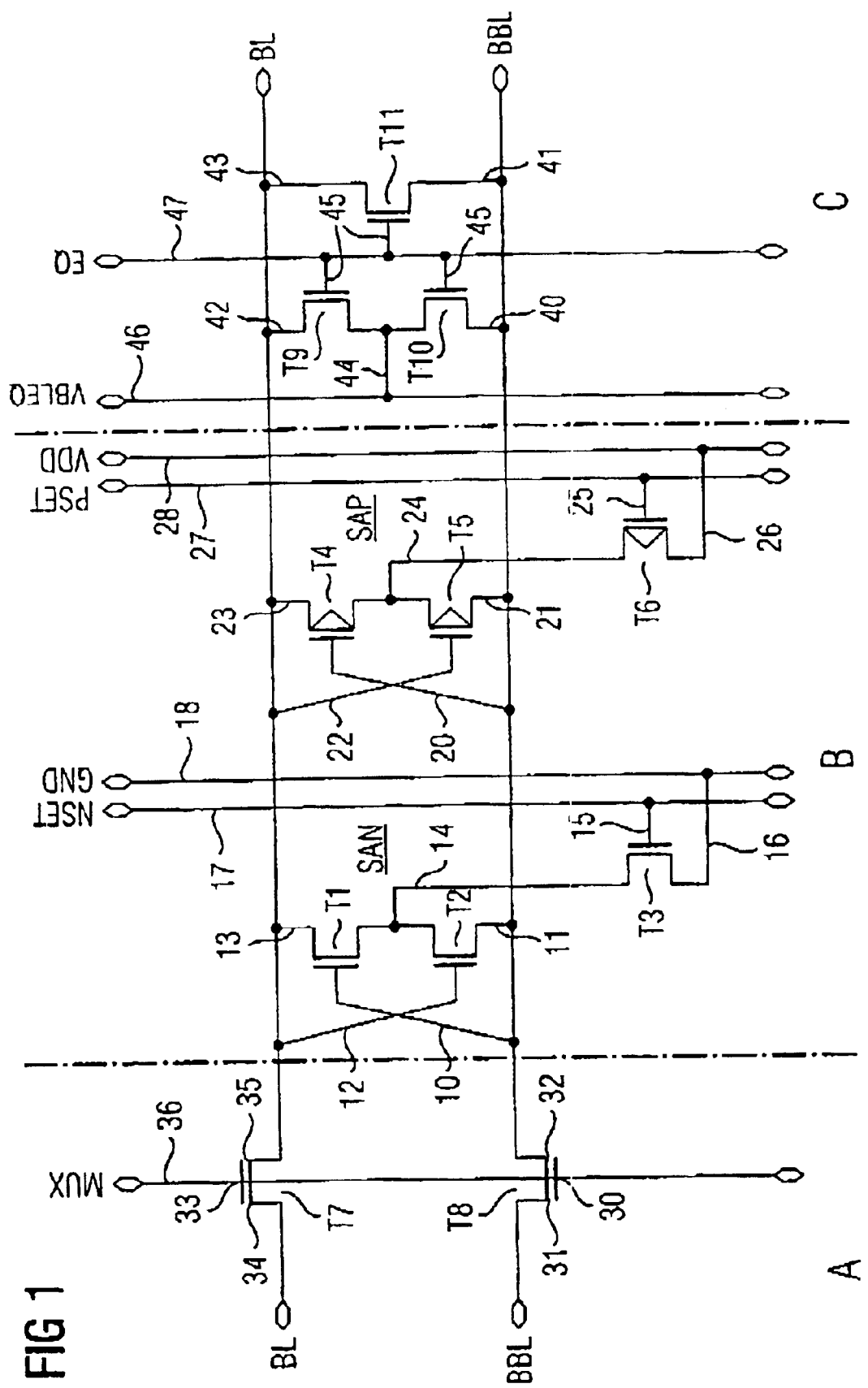
FIG. 1 shows, as described above, a customary read/write circuit for evaluating bit lines in a DRAM memory.
Figure 2:
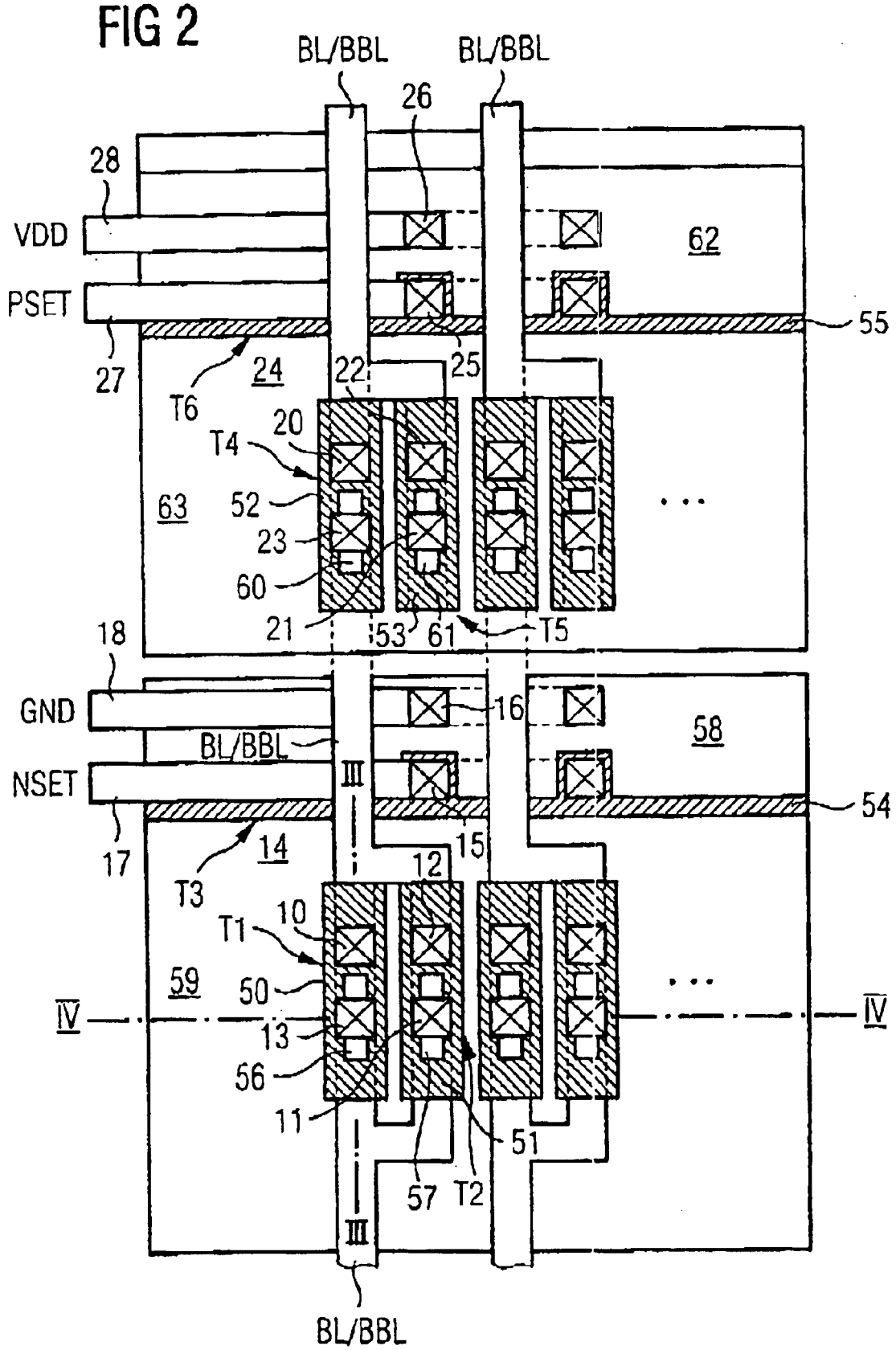
FIG. 2 shows an evaluation section of a read/write circuit according to the invention in a preferred embodiment of the present invention.
Figure 3:
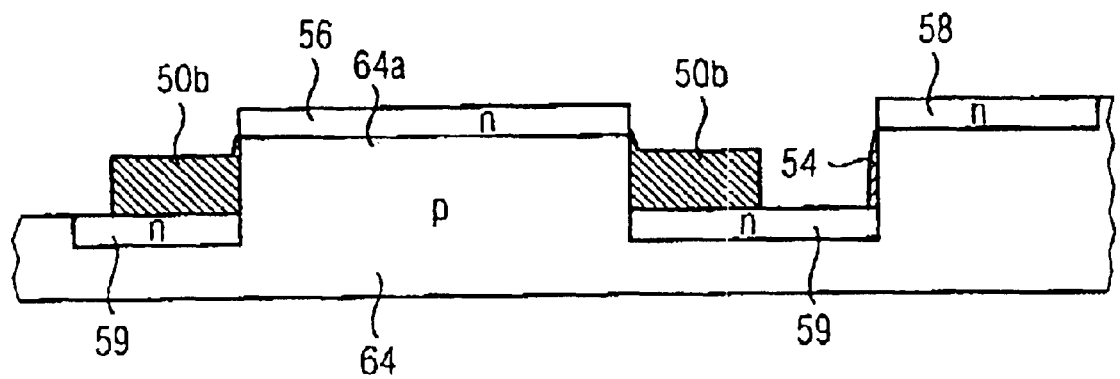
FIGS. 3 and 4 show crosssections through the integrated circuit shown in plan view in FIG. 2, along the section lines III and IV.
Figure 4:
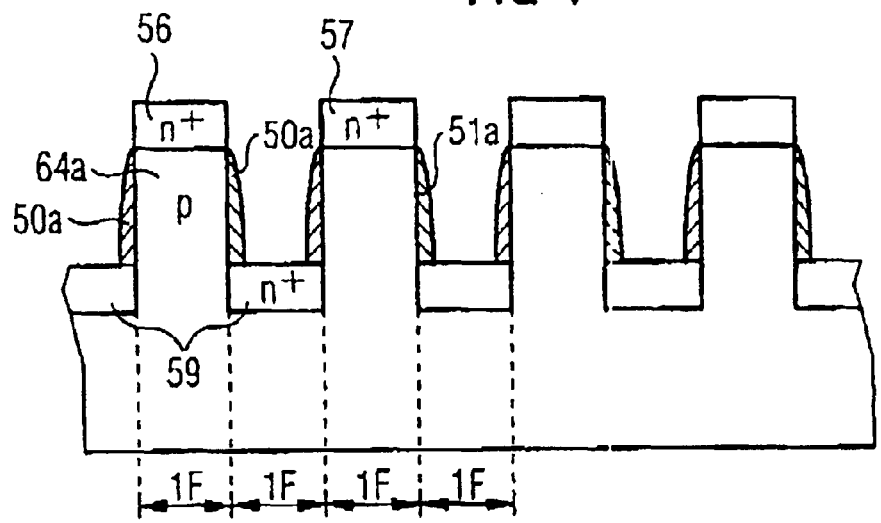

FIG. 2 shows the evaluation circuit and thus the heart of the read/write circuit according to the invention. The drawing shows, in plan view, two different regions of transistor pairs, which differ in the internal arrangement of their transistors and thus also in the doping of the different layers. The arrangement of silicon regions shown in FIG. 2 produces a circuit which corresponds to the evaluation circuit B of FIG. 1. Therefore, identical structures are provided with the same reference symbols. From the top region of the figure come two bit lines BL and BBL which are arranged vertically one above the other and are routed via the transistors T1 and T4 and parallel to the plane of the DRAM memory. The connections which reach vertically downward branch off from the bit lines. FIG. 2 shows the respective polysilicon regions of the transistors T1 to T4 and T3 and also T6 by means of hatched areas. The unhatched regions 56 in T1, 57 in T2, 60 in T4 and 61 in T5 are n-doped (56, 57) and respectively p-doped (60, 61) regions of the transistors which serve as source/drain regions. The source/drain regions and the polysilicon regions surrounding them are embedded all together in planar n-doped layers of T1, T2 and T3 (59) and respectively p doped common layers of T4, T5 and T6 (63). The three-dimensional construction of these different silicon regions is further illustrated by FIGS. 3 and 4, FIG. 3 illustrating a cross section in the direction of the bit lines, while FIG. 4 illustrates a cross section in the transverse direction with respect to the bit lines. As is evident, the substrate 64, which has a p-type doping in the case of the transistors T1 and T2, lies under the other structural elements used. Substrate projections 64a protrude from the substrate 64 and critically ensure the vertical arrangement of the transistors used according to the invention. An inversely doped layer 56 (n-doped in FIG. 3) is arranged on the projection and serves as a source/drain region of the transistor illustrated. The projection is surrounded by polysilicon 50 on all sides. Moreover, an oxide layer, which is not illustrated in the present case, is situated between the polysilicon gate region 50a and the substrate projection 64a and respectively the layer 56. As is evident from FIG. 3, the polysilicon gate regions 50a merge with polysilicon contact regions 50b which serve for making contact with the bit lines. The construction of the other transistors T2, T4 and T5 correspond, partly with the exception of the doping, to the construction of the transistor T1 shown in FIG. 3.

Furthermore, FIGS. 2 and 3 show vertically arranged transistors T3 and T6, which serve for connecting the voltage VDD and ground GND, respectively, to the vertical transistors. The required voltages are achieved via interconnects 18 for GND and respectively 28 for VDD, which bear with contacts 16 and 26, respectively, on a source/drain region 58 and 62, respectively, of the transistors T3 and T6, respectively. The transistors T3 and T6 are switched on and off by means of their polysilicon gate regions 54 and 55, respectively, which likewise bear vertically on a projection, via connections 15 and 25 and also interconnects 17 and 27 with the signals NSET and PSET, respectively. The SAN and SAP connections 14 and 24, respectively, of the circuit of FIG. 1 can thereby be realized in a simple manner. As is already illustrated in FIG. 1, the connections 10, 12, 20 and 22 serve for connecting the bit lines to the gate regions of the transistors T1, T2, T4 and T5. Likewise, the connections 11, 13, 21 and 23 serve for connecting the bit lines to the first source/drain regions of the transistors T1, T2, T4 and T5.

Figure 5:
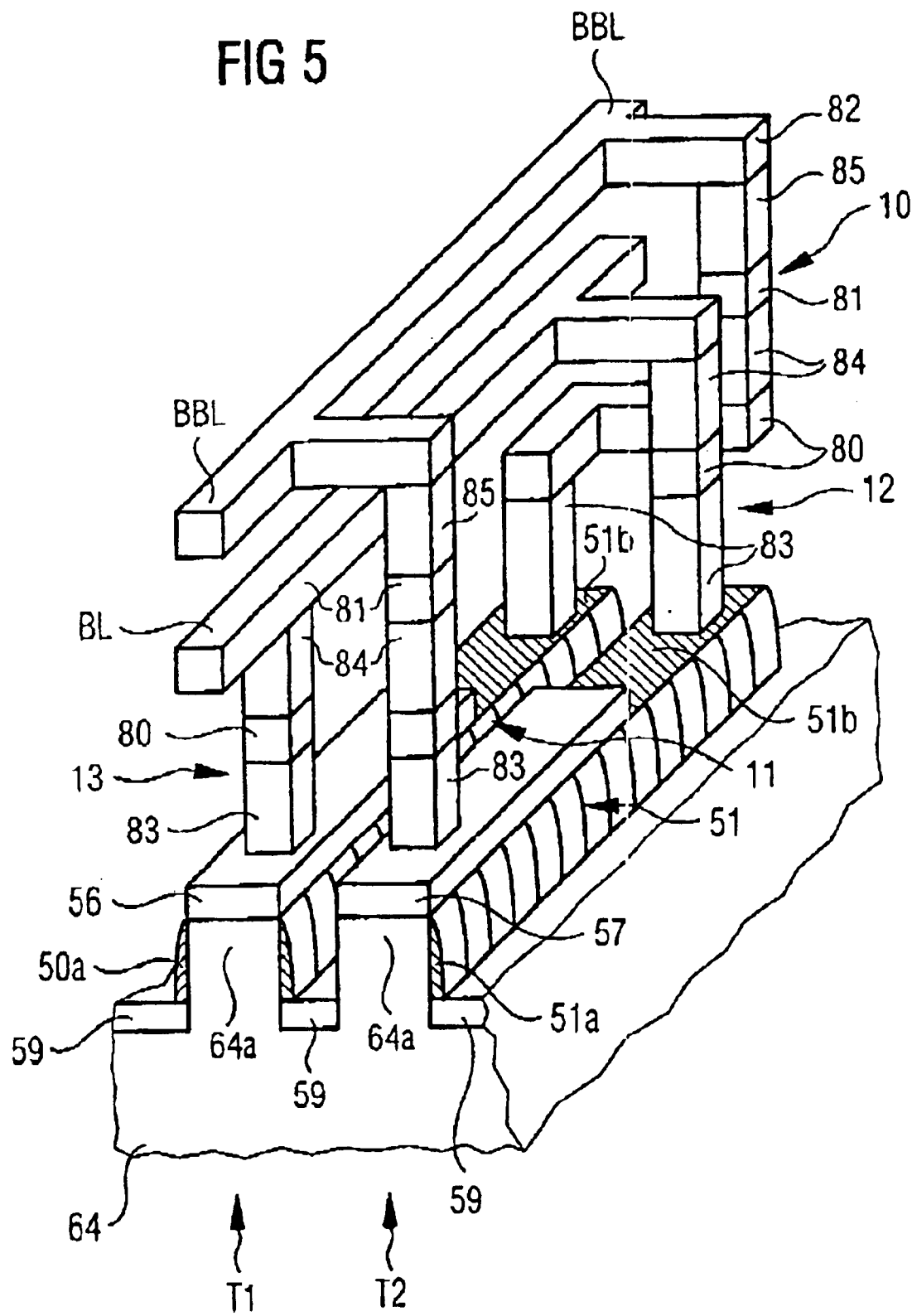
FIG. 5 shows, in a three-dimensional illustration, the connection of two bit lines to a transistor pair in accordance with a preferred embodiment of the present invention.

The concrete configuration of the connections reaching from the bit lines to the transistors is shown by way of example for the transistor pair T1/T2 in the three-dimensional illustration of FIG. 5. Here, too, identical reference symbols designate identical features. The figure shows how the polysilicon regions 50 and 51 reach around the substrate projections 64a and the layers 56, 57 and, in the rear region of the illustration, form a separate block 50b, 51b with a surface on which the connections 10, 12 can be applied. The connections 11 and 13 are arranged on the layers 57 and 56, respectively. FIG. 5 clearly shows the construction of the vertical transistors used according to the invention from a layer 56, 57 of a predetermined doping, a projection 64a which consists of the inversely doped substrate 64 and on which the layers 56 and 57 are supported, a layer 59, once again of the first orientation, which is arranged in the pits between the projections and to the sides of the projections, and also a polysilicon region 50 and 51, respectively, which surrounds the projection and partially, if appropriate, the layers 56 and 57.

FIG. 5 furthermore shows the two bit lines BL and BBL arranged one above the other and also the connection pillars 10, 11, 12 and 13 which proceed from said bit lines partly in a manner bending horizontally and then vertically, and partly in a directly vertical manner.

The connections and the bit lines are constructed in a multistage method expressed in different metallization planes. Firstly, the three metallization planes 80, 81 and 82 are discernable, which serve for horizontal propagation of the material used in each case, for example tungsten, and from which the actual bit lines are also composed. In regions without metal, the metallization planes are composed of an insulation material, for example an oxide. Insulation layers, for example oxide layers, are arranged between the three main metallization planes. In order to ensure the through-connection of the connections as far as the transistor plane, what are called contact holes are provided in said insulation layers, which contact holes are likewise filled with metal. This is indicated in the figure by the reference symbol 83 with regard to a first insulation layer, by the reference symbol 84 with regard to a second insulation layer and, finally, by the reference symbol 85 with regard to a third insulation layer.

Figure 6:
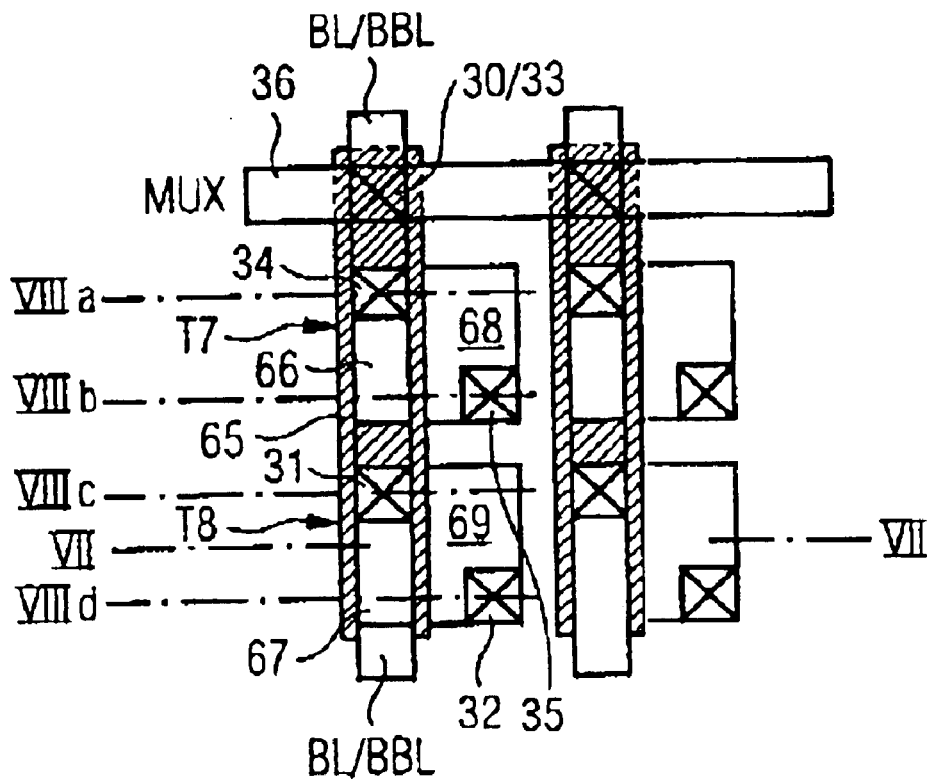
FIG. 6 shows, in plan view, a multiplexer circuit in accordance with a preferred embodiment of the present invention.

FIG. 6 shows, in plan view, the possible silicon layout of a multiplexer circuit of the read/write circuit according to the invention. In this case, the two transistors T7 and T8 have a common polysilicon gate region 65, while their source/drain regions 66, 67, and respectively 68, 69 are isolated from one another. The two bit lines BL and BBL are routed across the transistors and, with the contacts 31 and 32 in the case of transistor T8, and respectively 34 and 35 in the case of transistor T7, are connected thereto in the source/drain regions. Both bit lines are interrupted, the interruption of the bit line BL being situated approximately above the transistor T7, while the interruption in the bit line BBL is situated approximately above the transistor T8. Provided that the transistors are not activated by the MUX signal via the signal line 36 and the contact 30/33, it is thus not possible for current to flow between the connection 34 and 35 in the case of transistor T7, and respectively 31 and 32 in the case of transistor T8, and the bit lines are interrupted.

Figure 7:
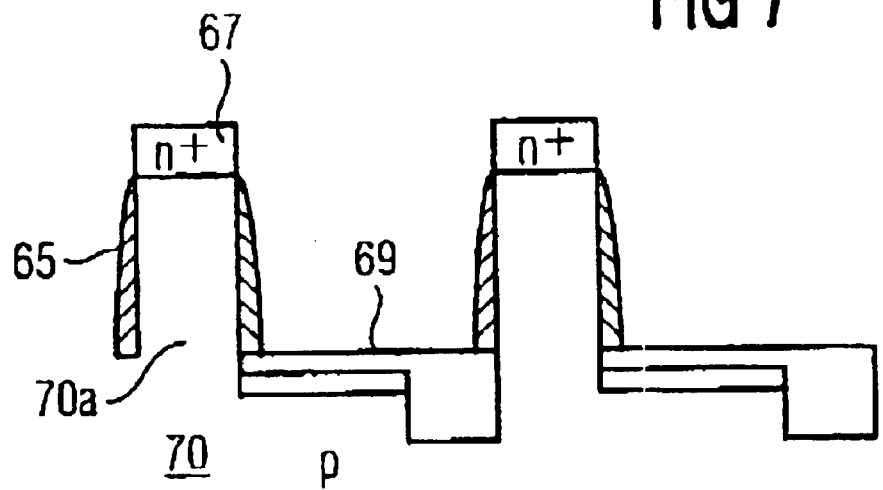
FIG. 7 shows a cross section through a vertical transistor in a multiplexer circuit along the section line VII of FIG. 6.
Figure 8D:
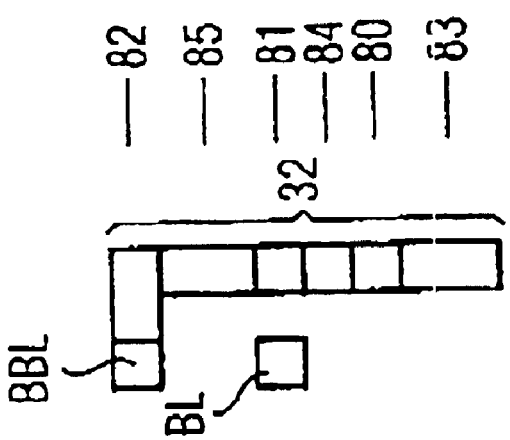
FIG. 8 shows in cross section, along the section lines VIIIa to VIIId of FIG. 6, the arrangement of the two bit lines running vertically one above the other in the multiplexer circuit.
Figure 8C:
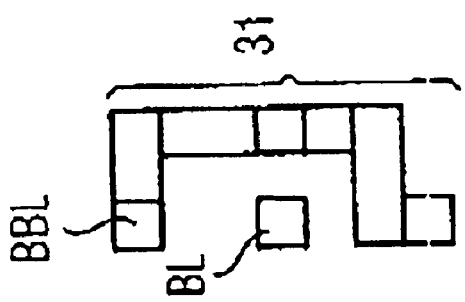
Figure 8B:
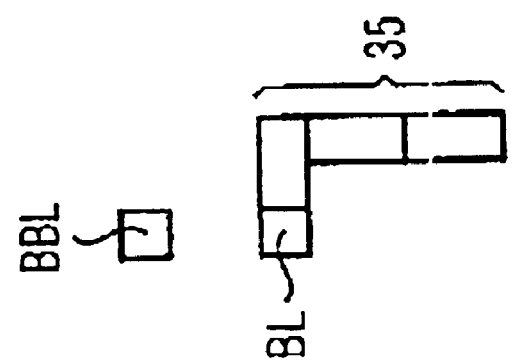
Figure 8A:
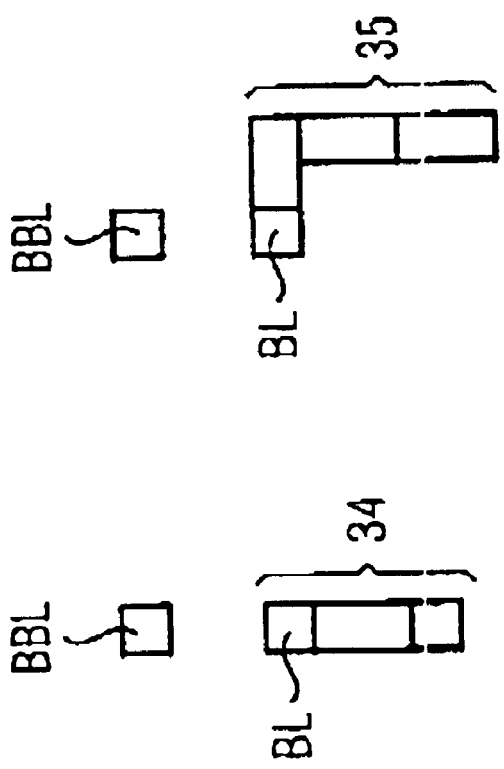

FIG. 7 shows a cross section through the circuit arrangement shown in FIG. 6, along the cross-sectional line VII. Here, too, the vertical construction of the transistors is once again clearly discernible, which comprises, in addition to a substrate 70 forming a projection 70a, an inversely doped layer 67 above the projection and a likewise inversely doped layer 69 beside the projection 70a. The polysilicon region 65 is once again separated from the substrate 70 by an oxide layer (not illustrated).

FIG. 8 shows cross sections through the bit lines and connection regions of the multiplexer circuit shown in FIG. 6, along the section lines VIIIa to VIIId. The connection 34 from the bit line BL in this case protrudes directly down onto the region 66 of the transistor T7, said region being n-doped in the present case. Behind this connection, the bit line BL is interrupted. FIG. 8b shows the other connection 35 of the bit line BL, which leads from the other n-doped source/drain region of the transistor T7 to the resumed bit line BL. FIGS. 8c and 8d show the same facts with regard to the bit line BBL and the connections 31 and 32. It is apparent here, in particular, that once again complex configurations of the connections are possible on account of the plurality of available metallization planes (depicted on the right) and contact holes through the insulation layers.

Figure 9:
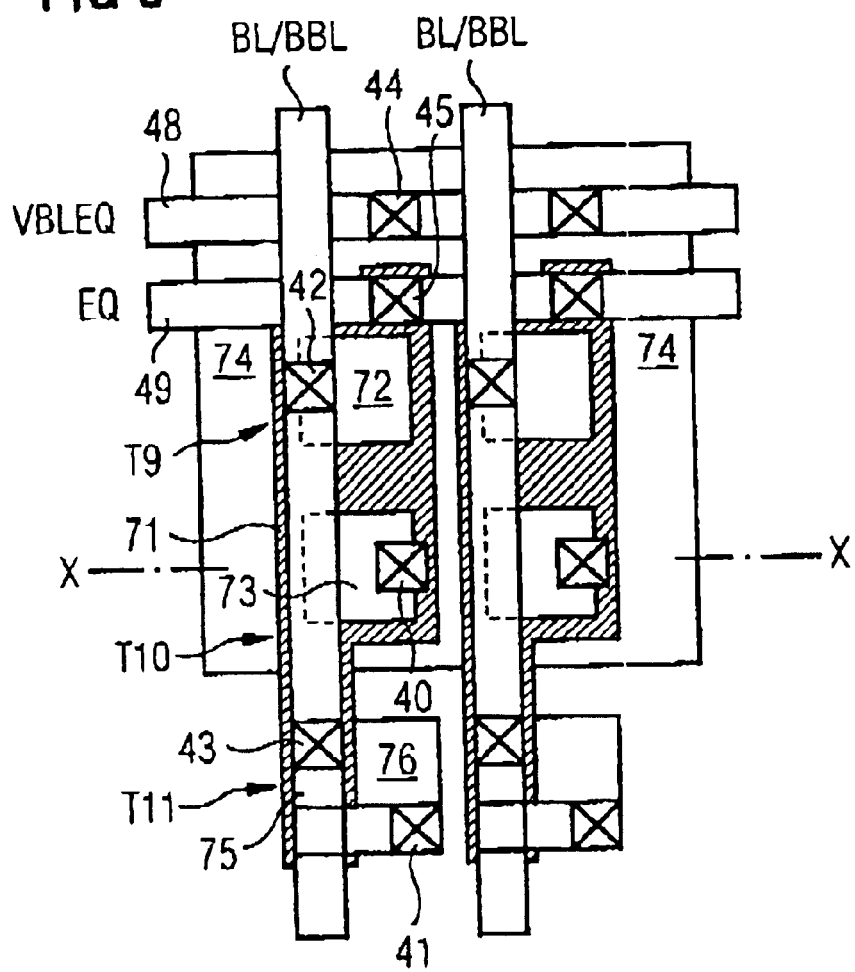
FIG. 9 shows, in plan view, a precharge/equalize circuit in accordance with a preferred embodiment of the present invention.

FIG. 9 shows a precharge/equalize circuit in accordance with a further preferred embodiment of the read/write circuit according to the invention. As is evident, all three transistors T9, T10 and T11 are connected to one another by a common polysilicon region 71, and to the interconnect 49 for providing the signal EQ via the connection 45. Moreover, the transistors T9 and T10 have a common source/drain region 74, which, via the connection 44 to the interconnect 48, ensures the provision of the signal VBLQ. The bit lines BL and BBL routed across the circuit branch off downward. The bit line BL is connected by the connection 42 to the second source/drain region 72 of the transistor T9, while the bit line BBL is connected via the connection 40 to the second source/drain region 73 of the transistor T10. The bit line BL is furthermore connected via the connection 43 to a source/drain region 75 of the transistor T11, while the bit line BBL is connected via the connection 41 to the other source/drain region 76 of the transistor T11.

Figure 10:
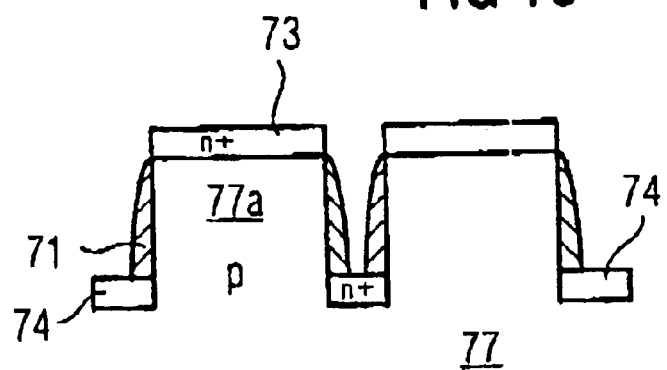
FIG. 10 shows, in crosssection, the transistors of the precharge/equalize circuit along the section line X of FIG. 9.

FIG. 10 once again shows a cross section along the cross-sectional line X of FIG. 9 of the precharge/equalizer according to the invention. As is evident, the transistors are in this case embodied twice as wide as in the other examples. This can be attributed to the fact that, on account of only three transistors used, it is possible and expedient for the transistors to be arranged one behind the other, so that the full grid (for example 4F) is available for each of the transistors, and with the wider embodiment it is likewise possible for both bit lines to be connected to the upper source/drain regions of the vertical transistors according to the invention without the connections being wrapped around the bit lines. The transistors are built on a projection 77a in the substrate 77.

The preceding drawings each represent two grids and hence also two bit line pairs, in order to illustrate that there are a multiplicity of bit lines arranged beside one another in DRAM memories. The construction of the respective second arrangement corresponds exactly to that of the first arrangement, which is provided with reference symbols. In addition, by using in each case two read/write circuits according to the invention in the illustration of the figures, it can be shown that specific signal lines or specific elements of the transistors (for example the polysilicon region 54, 55 or the source/drain region 59, 63 in FIG. 2) can actually be used jointly by all read/write circuits which are arranged in a contiguous region of a DRAM memory.

In order to be able to realize the narrower grid required for modern DRAM memories, the following properties that are possible with vertical transistors are exploited in the present invention:

the vertical transistor gate takes up hardly any planar area, the channel length can be selected irrespective of the lithography used, the signals which are identical for all the read/write amplifiers of an arrangement, for example SAN, SAP or VBLEQ, can be embodied continuously, that is to say without insulation, in a plane in the form of a common source/drain region.

Moreover, in conventional memories, the minimum feature size F can actually be achieved only in the cell array, while only a feature size of about 1.5 to 2F is available in the periphery, that is to say also in the region of read/write amplifiers. On account of the high periodicity that can be achieved with the vertical transistors, it is now also possible, however, to realize the minimum lithography size F in the case of the read/write amplifier as well.

If vertical transistors are also used for the provision of the actual cell architecture in the actual DRAM matrix memory area the additional technological outlay for the read/write circuit according to the invention can be kept low since the vertical patterning, for example with regard to trench, poly spacer wordline, etc., can be formed from the cell array.

In addition to a 4F grid, the use of vertical structures enables a favorable layout in respect of areas in the longitudinal direction of the read/write amplifier according to the invention. Thus, as a result of the above-described annular, or enclosing embodiment of the vertical transistor gate, the channel width can be increased to at least twice the geometrical width of the source/drain region.

The method for fabricating the read/write circuit according to the invention will also be briefly discussed below.

Firstly, an underlying substrate is n- or p-doped in accordance with the specifications. Afterward, a lithography is carried out, and the envisaged depressions or trenches are etched away between the projections of the individual vertical transistors. Afterward, the newly formed surfaces are doped by implantation. In the next step, the gate region of the vertical transistors is oxidized in order to form an oxide layer. This is followed by the deposition of a polysilicon layer which covers the entire structure hitherto formed. A lithography is subsequently carried out in order to be able to outline the envisaged gate connection regions (which are clearly shown as protruding away to the rear in FIG. 5, for example and are shown hatched in FIG. 2, for example). Anisotropic dry etching then finally leads to the formation of the polysilicon regions illustrated, in the case of which the typical spacers form around the projections of the vertical transistors from the substrate. The resultant structure is best shown in FIG. 3.

In order to insulate the different electrical elements of the vertical transistors thus formed, all existing depressions are filled with oxide. After a planarization step that is then necessary, for example by means of CMP, a further photolithography can be carried out on the planar surface thereby formed, the contact holes 83 being formed with the aid of said photolithography, which contact holes can be filled with a metal, for example tungsten, which is deposited from tungsten fluoride.

After a further planarization by means of chemical mechanical polishing, the first metallization plane 80 can then be deposited, which subsequently acquires its interconnect structure by means of a lithographic method and an etching step. The further contact holes/oxide layers and metallization planes are superposed on these first ones in the same way.

With regard to the metal planes, it is likewise possible to take the opposite route. In this case, oxide layers are deposited first rather than the metal planes. These oxide layers are treated, if appropriate, in a two-stage method by means of photolithography and etching in such a way as to produce the interconnects and contact hole structures in the oxide. Afterward, the resulting depressions of the contact holes and of the interconnects are filled with a suitable metal. The term damascene technique is mentioned in this context.

The additional steps—necessary compared with conventionally fabricated and constructed read/write circuits—in the fabrication of vertical transistors and in the more complex construction of the metal planes above the transistors lead to increased costs which have to be balanced against the gain in the degree of miniaturization.

We claim:

1. An integrated circuit for evaluating at least one bit line in a DRAM memory, the integrated circuit comprising:
   a read/write circuit with at least one vertical transistor, said at least one vertical transistor including a first transistor pair having vertical evaluation transistors with identical channel types, and a second transistor pair having vertical evaluation transistors with identical channel types.

2. The circuit according to claim 1 wherein:
   said vertical evaluation transistors of said first transistor pair have a common source/drain region; and
   said vertical evaluation transistors of said second transistor pair have a common source/drain region.

3. The circuit according to claim 2, wherein said read/write circuit comprises:
   a vertical transistor for connecting a voltage to said first transistor pair; and
   a vertical transistor for connecting a voltage to said second transistor pair.

4. The circuit according to claim 1, wherein said read/write circuit comprises:
   a first vertical transistor for connecting a first voltage to said first transistor pair; and
   a second vertical transistor for connecting a second voltage to said second transistor pair.

5. The circuit according to claim 4, wherein:
   said vertical evaluation transistors of said first transistor pair and said first vertical transistor have a common source/drain region; and
   said vertical evaluation transistors of said second transistor pair and said second vertical transistor have a common source/drain region.

6. The circuit according to claim 5, comprising:
   a first set line for connecting the first voltage to said first vertical transistor and to said first transistor pair; and
   a second set line for connecting the second voltage to said second vertical transistor and to said second transistor pair.

7. The circuit according to claim 1, comprising:
   at least one bit line having a grid width;
   each one of said vertical evaluation transistors of said first transistor pair and each one of said vertical evaluation transistors of said second transistor pair having a width in a transverse direction with respect to said at least one bit line that substantially corresponds to said grid width.

8. The circuit according to claim 1, comprising:
   at least one bit line; and
   a multiplexer circuit for switching said at least one bit line, said multiplexer circuit including vertical transistors.

9. The circuit according to claim 8, wherein at least some of said vertical transistors of said multiplexer circuit have a common polysilicon gate region.

10. The circuit according to claim 9, comprising a multiplexer signal source connected to said common polysilicon gate region.

11. The circuit according to claim 1, comprising a precharge/equalize circuit having vertical transistors.

12. The circuit according to claim 11, wherein at least some of said vertical transistors of said precharge/equalize circuit have a common polysilicon gate region.

13. The circuit according to claim 12, comprising an equalizer signal source connected to said common polysilicon gate region of said at least some of said vertical transistors of said precharge/equalize circuit.

14. The circuit according to claim 11, comprising:
    a voltage source; and
    at least one bit line;
    said vertical transistors of said precharge/equalize circuit including at least one transistor having a source/drain region connected to said voltage source.

15. The circuit according to claim 14, wherein:
    said at least one bit line includes a plurality of bit lines;
    said vertical transistors of said precharge/equalize circuit include a plurality of transistors having a common source/drain region;
    said plurality of said transistors of said precharge/equalize circuit includes a transistor for each one of said plurality of said bit lines.

16. The circuit according to claim 1, comprising two bit lines connected to said read/write circuit.

17. The circuit according to claim 16, wherein said two bit lines are configured above said read/write circuit and are configured one above another with respect to a main plane of a DRAM memory.

18. The circuit according to claim 1, comprising:
    two bit lines; and
    a plurality of substantially vertical interconnects;
    said vertical evaluation transistors connected to said bit lines by said plurality of said interconnects.

19. An integrated circuit for evaluating at least one bit line in a DRAM memory, the integrated circuit comprising:
    a read/write circuit with at least one vertical transistor, said at least one vertical transistor including:
        a substrate material having a doping;
        a channel region defined by a projection formed on said substrate material, said projection having side walls;
        a first source/drain region defined by a layer that is configured on said projection and that is made of a material having a doping that is inverse to said doping of said substrate material;
        a second source/drain region defined by a layer that is configured on said substrate material beside said projection and that is made of a material having a doping that is inverse to said doping of said substrate material;
        a junction formed between said second source/drain region and said side walls of said projection; and
        a polysilicon region configured on said side walls of said projection and on said junction.

20. The circuit according to claim 19, comprising:
    at least one bit line having a grid; and
    a transistor pair including said at least one vertical transistor;
    said projection of said at least one transistor having a width fitting into said grid of said bit line.

21. The circuit according to claim 20, wherein said width of said projection fills said grid of said bit line.

22. The circuit according to claim 19, comprising:
    at least one bit line having a grid;
    said projection of said at least one transistor having a width filling said grid of said bit line.

23. An integrated DRAM memory comprising a read/write circuit having at least one vertical transistor, aid at least one vertical transistor including a first transistor pair having vertical evaluation transistors with identical channel types, and a second transistor pair having vertical evaluation transistors with identical channel types.

24. An integrated write/read circuit for evaluating at least on bit line in a DRAM memory, comprising:
    at least two transistor pairs, each of said two transistor pairs having vertical transistors of a same channel type for evaluation; and further vertical transistors connected to said vertical transistor for switching voltages to said two transistor paris, said vertical transistors of each of said two transistor pairs and a corresponding one of said further vertical transistor sharing a common source/drain region.

* * * * *

UNITED STATES PATENT AND TRADEMARK OFFICE
CERTIFICATE OF CORRECTION

PATENT NO. : 6,822,916 B2
DATED : November 23, 2004
INVENTOR(S) : Alexander Frey et al.

It is certified that error appears in the above-identified patent and that said Letters Patent is hereby corrected as shown below:

Title page,
Item [21], should read as follows: -- Feb. 28, 2001 --

Signed and Sealed this

Eighth Day of February, 2005

JON W. DUDAS
*Director of the United States Patent and Trademark Office*